United States Patent
Miyatake

(10) Patent No.: US 9,330,794 B1
(45) Date of Patent: May 3, 2016

(54) DRAM-BASED ANTI-FUSE CELLS

(71) Applicant: Micron Technology, Inc., Boise, ID (US)

(72) Inventor: Shinichi Miyatake, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/638,831

(22) Filed: Mar. 4, 2015

(51) Int. Cl.
  *G11C 17/00* (2006.01)
  *G11C 29/00* (2006.01)
  *G11C 17/16* (2006.01)
  *G11C 17/18* (2006.01)

(52) U.S. Cl.
  CPC .............. *G11C 29/783* (2013.01); *G11C 17/16* (2013.01); *G11C 17/18* (2013.01)

(58) Field of Classification Search
  CPC ....... G11C 17/18; G11C 17/16; G11C 29/785
  USPC .................................................... 365/96, 149
  See application file for complete search history.

(56) References Cited

U.S. PATENT DOCUMENTS

| 5,724,282 A * | 3/1998 | Loughmiller .......... G11C 17/16 365/200 |
| 6,462,998 B1 * | 10/2002 | Proebsting ............... G11C 7/04 257/E21.659 |
| 6,747,889 B2 | 6/2004 | Derner et al. |
| 7,924,599 B1 * | 4/2011 | Evans, Jr. ........... G11C 11/5657 365/145 |

* cited by examiner

*Primary Examiner* — Son Dinh
(74) *Attorney, Agent, or Firm* — Dorsey & Whitney LLP

(57) ABSTRACT

Apparatuses and methods for programming and reading from anti-fuse cells are disclosed herein. For example, a semiconductor device may include a plurality of word lines, a plurality of bit lines, a cell plate, a plurality of cells, and a control circuit. Each of the plurality of cells includes a switch and a capacitor coupled in series between an associated one of the plurality of bit lines and the cell plate, and the switch is controlled by an associated one of the plurality of word lines. The control circuit is configured to provide the cell plate with a first voltage and further configured to change the cell plate from the first voltage to a second voltage before one of the plurality of word lines is activated.

25 Claims, 12 Drawing Sheets

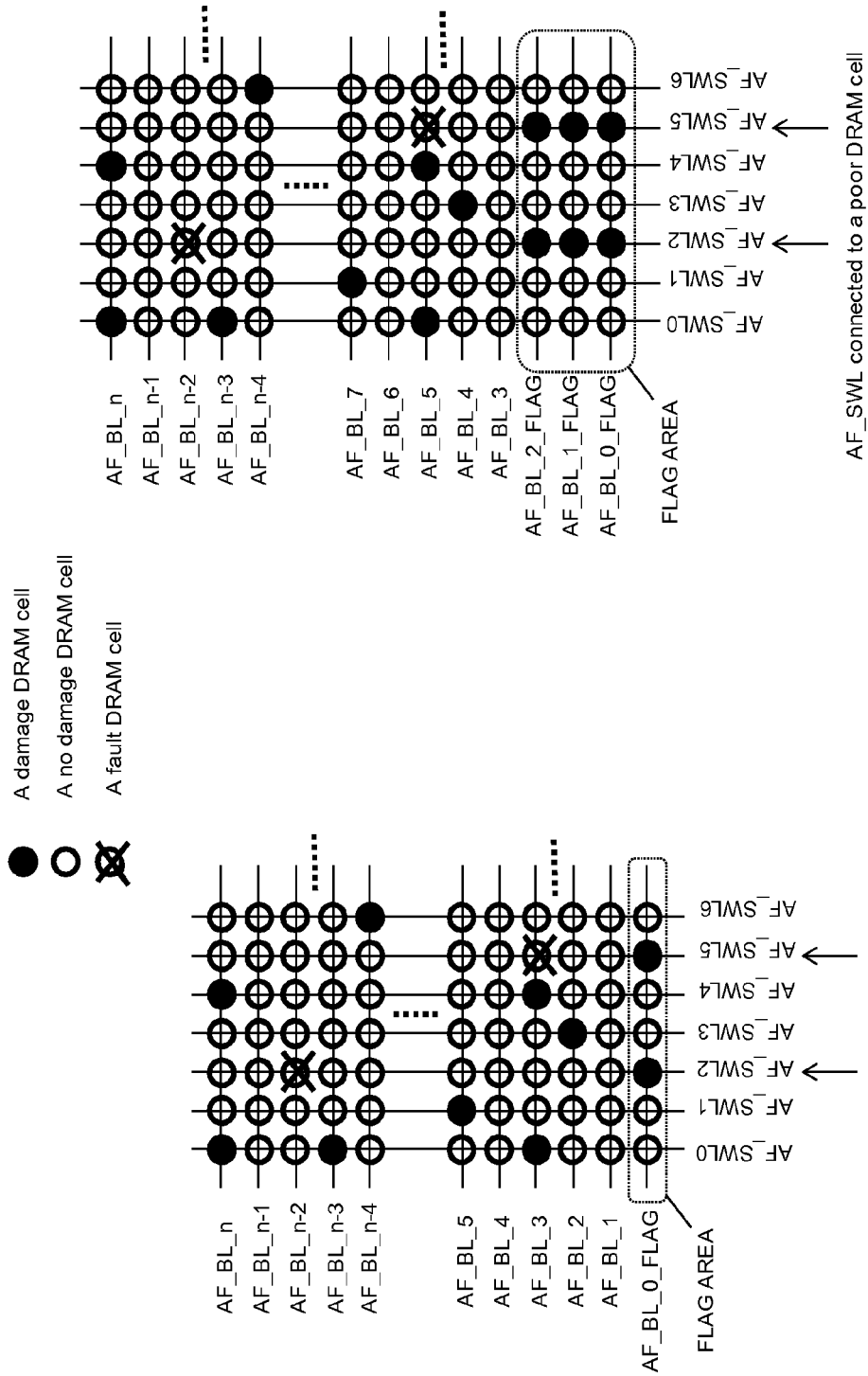

DRAM-BASED ANTI-FUSE CELLS

BACKGROUND

Conventional dynamic random access memory (DRAM) may include a large number of memory cells and control circuits. The memory cells may form an array of memory cells with each memory cell including a switch and a capacitor. The memory cells may be arranged in rows and columns in the array of memory cells. The switch may provide access to the capacitor, which stores charge representing a high or low logic state. The charge stored in a memory cell may represent a bit of data, which may be combined with other bits to produce bytes or words of data. The control circuits may be configured to allow data to be read from or written to the array of memory cells responsive to received memory commands.

Due to process variations and impurities, defects may occur during the DRAM fabrication process. The defects may result in one or more memory cells being defective. The defective memory cells may not operate as intended, which may result in bad memory cells within the array of memory cells. The defective memory cells may be uncovered during testing DRAM die undergo during and after fabrication. Redundant memory cells, e.g., columns and/or rows of redundant memory cells, may be included in the DRAM so that defective cells may be replaced. For example, a full column or row of cells may that contain one or more defective cells may be replaced by a redundant column or row of cells. In order to replace a row or column that contains a defective memory cell, a physical address of the row/column that includes the defective cell may need to be stored by the DRAM in a non-volatile manner. The address of the replacement row/column may also need to be stored. The control circuits may access the stored physical address when writing and/or reading operations are performed so that the replacement row/column is accessed instead of the row/column that includes the defective memory cell.

Due to the perpetuity of the defective memory cells and the corresponding replacement rows/columns, the physical address of their locations may need to be permanently stored. Yet, the memory cells of a DRAM are volatile, and charge stored in a DRAM memory cell may last only a short time. As such, storing physical addresses of the defective and/or replacement rows/columns in a standard DRAM memory cell may not be as permanent as desired. While prior solutions may have included non-volatile memory cells fabricated with DRAM memory cells, or even using DRAM cells as non-volatile cells, these solutions have drawbacks. For example, fabricating non-volatile and volatile cells on a same die may produce fabrication difficulties and require different control circuits, which may lead to excessive die area. The prior attempts at using DRAM memory cells as non-volatile cells may have also been die area intensive.

BRIEF DESCRIPTION OF THE DRAWINGS

FIGS. 12A and 12B are diagrams of anti-fuse arrays including fault cell flag areas in accordance with the present disclosure.

DETAILED DESCRIPTION

Apparatuses and methods for programming and reading from anti-fuse cells are disclosed herein. The anti-fuse cells may be conventional DRAM memory cells, but are programmed so that they retain data in a non-volatile manner. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
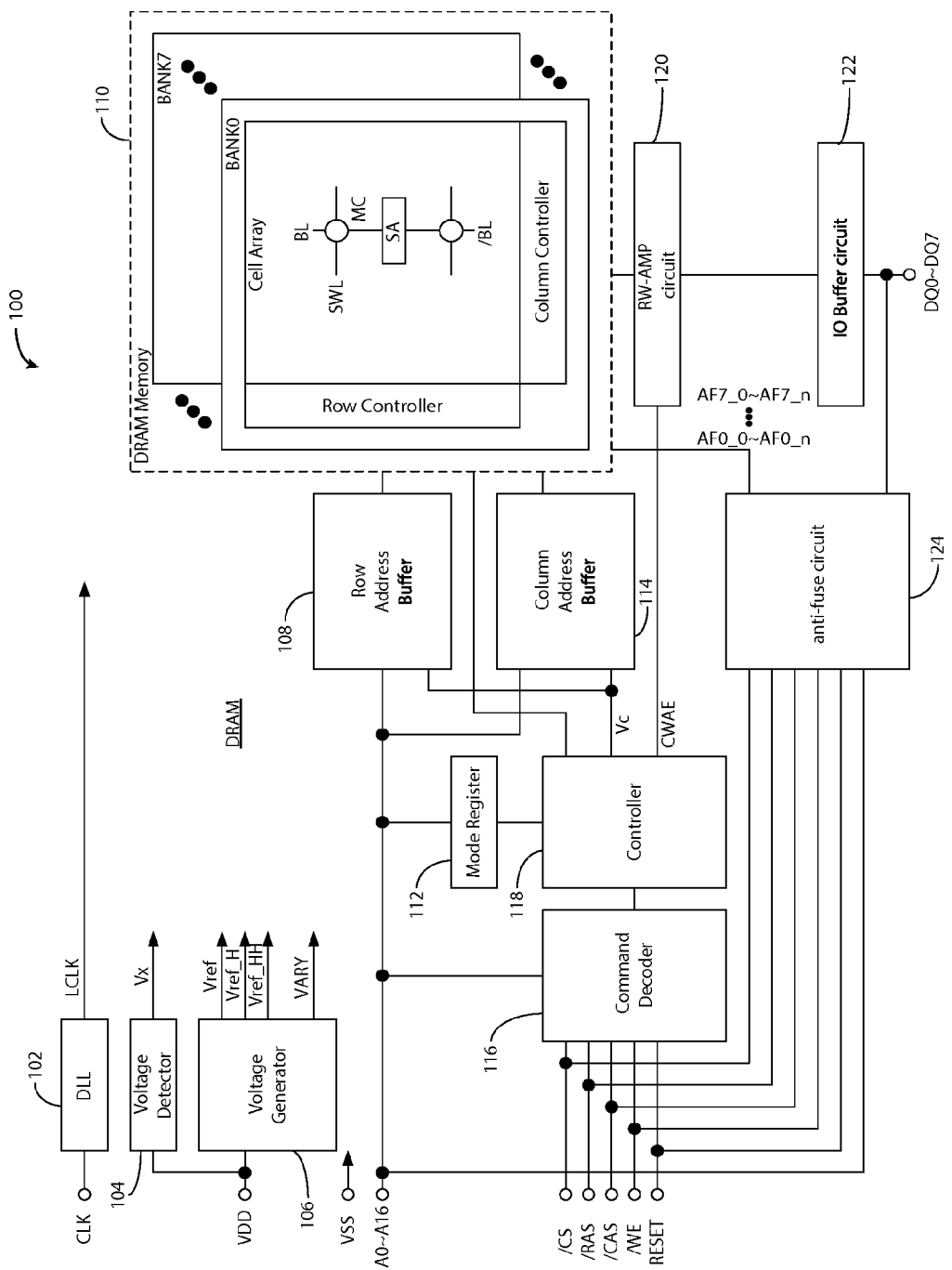
FIG. 1 is a block diagram of a DRAM in accordance with the present disclosure.

FIG. 1 is a block diagram of a DRAM 100 in accordance with the present disclosure. The DRAM 100 may receive, from external components through a memory controller for example, a clock signal, a voltage source VDD, a voltage source VSS, addresses signals on address lines A0-A16, and command signals such as chip select (/CS), row address strobe (/RAS), column address strobe (/CAS), write enable (/WE), and RESET. In response to the various inputs, the DRAM 100 may perform various memory commands such as writes, reads, refresh, and etc. For example, in response to a read command and a corresponding address, the DRAM 100 may access data stored in the memory array 110 at the address received, and provide the stored data on output lines DQ0-DQ7. The various control and periphery circuits 102-124 depicted in FIG. 1 may operate based on the received memory commands and address signals to ensure the data is provided on the output lines at a desired time.

The DRAM 100 may operate on an internal clock signal LCLK that is provided by a delay locked loop (DLL) 102. The DLL 102 may receive an external clock signal CLK and provide the LCLK signal in response. The LCLK signal may be a phase and/or frequency derivative of the CLK signal. The LCLK signal may be provided to all of the components of the DRAM 100 and may determine when the various operations of the DRAM 100 are performed. For example, the movement of address signals and command signals within the DRAM 100 and the corresponding access of memory cells may occur on transitions of the internal clock LCLK. The clock signal may allow the DRAM 100 to time the output and/or input of data at desired times dictated by a host, for example.

An external power source may provide the supply voltage VDD, which may be a positive voltage, 1.5 volts for example. The supply voltage VDD may be received by a voltage detector 104 and a voltage generator 106 of the DRAM 100. The voltage detector 104 in some embodiments may provide a control signal Vx to the DRAM 100 indicating that the supply voltage VDD is changing, e.g., transitioning from zero to the VDD voltage, and may further indicate that the DRAM 100 is being powered up. The voltage generator 106 may receive the supply voltage VDD and generate a range of other voltages based thereon, such as Vref, Vref_H, Vref_HH, and VARY. Here, the voltage VARY may be less than the power supply voltage VDD, and may be the main voltage source for powering the DRAM 100. Further, the voltage VARY may indicate a high logic state, a "1" for example. The voltage Vref may be half the voltage VARY, the voltage Vref_H may be in between Vref and VARY, and the voltage Vref_HH may be greater than VARY. The various reference voltages may be provided separately to different circuits of the DRAM 100 and/or may be provided at different times. For example, the array 110 may receive all four reference voltages from the voltage generator 106, but those voltages may be received and/or applied to the cells of the array 110 at different times depending on a command type. The voltage input VSS may be a ground voltage, e.g., zero volts. The supply voltages VDD and VSS may represent two potentials the DRAM 100 is designed to operate within.

For an example of the voltage levels of each of the reference voltages, the VARY, main operating voltage, may be 1.0 volts, and Vref may be half VARY, which would be 0.5 volts. Vref_H may be between Vref and VARY, and may be 0.8 volts in some embodiments. Lastly, Vref_HH may be greater than VARY, and may be 4.0 volts. The given values are only examples and other values would fall within the scope of the present disclosure. The use of multiple reference voltages, which should become apparent based on the discussion below, may be used in both programming and reading from anti-fuse (AF) cells included in an anti-fuse (AF) circuit 124. For example, the high reference voltage Vref_HH may be applied to the AF cells to program the cells to a desired logic state.

The DRAM 100 may include a cell array 110 configured to store data in a plurality of memory cells contained therein. The cell array 110 may include memory cell banks 0-7, with each bank including a plurality of memory cells arranged in a grid, for example, and a plurality of bitlines and wordlines. The memory cells included in the cell array 110 may be conventional DRAM cells as one skilled in the art would understand. The grid of memory cells may be in the form of columns and rows where a column may be associated with a wordline and a row may be associated with a bitline. The plurality of bitlines and wordlines may be arranged normal to one another so that a grid may be formed. A memory cell may be associated with an intersection of a bitline and a wordline. Further, the plurality of bitlines may include a plurality of complementary bitlines. Each bank 0-7 may additionally include a number of redundant columns and/or rows of memory cells that may be used to replace columns and/or rows of memory cells that contain a fault cell, e.g., a defective cell.

Addresses received on the address lines A0-A16 may be provided to a row address buffer 108, a column address buffer 114, a mode register 112, a command decoder 116, and the AF circuit 124. The addresses received may be used by the receiving components to access, e.g., activate, one or more memory cells within the cell array 110, among other things. Based on a received command associated with an address, data may be read from or written to memory cells associated with the received address. The row address buffer 108 may receive a subset of the address lines A0-A16, address bits A0-A7 for example, and access the memory cells in the array 110 along that row via a row controller of one or more banks 0-7 of the cell array 110. The row controller may activate a wordline or sub-wordline of the cell array 110. The column address buffer 114 may perform a similar function for a column of the memory array 110 based on the remaining bits of the address lines A0-A16, address bits A8-A16 for example. The column address buffer 114 may provide the column address to a column controller of one or more of the banks 0-7. The column controller may activate a plurality of bitlines in response to the physical address provided by the column address buffer 114. The row and column address may define a number of memory cells based on the intersection of activated wordlines and bitlines, which are to be accessed.

The command decoder 116 may receive the command signals /CS, /RAS, /CAS, /WE, and RESET, in addition to the address lines A0-A16. Based on the commands received, e.g., a combination of the command signals, the command decoder 116 may determine one or more internal operations to perform in order to carry out the received command. In some embodiments, the one or more internal operations may be implemented in a set sequence to perform the command. Based on the address and the command, the command decoder may provide one or more signals to the controller 118, which may be configured to carry out the internal operations based on the one or more signals. The controller 118 may buffer the commands received and may apply control signals to the memory array 110 at a time when the associated address is applied to the memory array 110 by the row and column address buffers 108 and 114. In response, the memory cells activated by the address may be read from or written to depending on the command.

The address may access a wordline of memory cells located in one or more of the banks 0-7 of the cell array 110. Each of the banks 0-7 may include, in addition to the array of memory cells, one or more sense amplifiers. For example, each of the plurality of bitlines may have an associated sense amplifier. The sense amplifiers may be configured to amplify data signals on the bitlines during read and write operations. The sense amplifiers may be activated by connecting one or more control lines to one of the reference voltages provided by the voltage generator 106, voltage VARY for example. In response, a voltage on a bitline may be amplified. The plurality of memory cells included in each bank 0-7 may be activated by enabling a combination of a bitline and wordline.

The read/write amplifier circuit 120 may be coupled between the memory array 110 and an input/output (JO) buffer circuit 122. The read/write amplifier circuit 120 may be controlled by the controller 118, and, based on a control signal received, may provide data to or receive data from one or more of the banks 0-7 of the memory array 110. Additionally, the IO buffer circuit 122 may provide data from or provide data to the data lines DQ0-7.

As noted above, memory cells of a memory array may include fault cells. To overcome a loss of storage capacity, the DRAM 100 may also include redundant cells, which may be used to replace a column or row of memory cells in the cell array 10. Each bank 0-7 of the memory array 110 may include redundant rows and/or columns for this purpose. The physical address of the defective and/or replacement rows/columns may be stored in the AF circuit 124. These physical addresses may be referred herein as fault addresses. The AF circuit 124 may include anti-fuse cells and control circuits for accessing the anti-fuse cells. The anti-fuse cells, for example, may be conventional DRAM cells substantially similar to the DRAM cells of the cell array 110. The control circuits included in the AF circuit 124 may be similar to the control circuits of the DRAM 100 as well. The AF cells may be programmed to permanently store a low or high logic state so that the addresses of the fault and/or replacement rows/columns in the cell array 110 are stored. During performance of a memory command by the DRAM 100, the AF circuit 124 may provide the address of the defective and/or replacement rows/columns to one or more row controllers of one or more corresponding banks 0-7 of the memory array 110. One or more of the column controllers may also receive the address from the AF circuit 124. The one or more row and/or column controllers may compare an address received from the column and row address buffers with the fault address provided by the AF circuit 124 to determine if the received address includes one or more of the fault rows/columns. If a fault row/column is addressed, the corresponding replacement rows/columns may be accessed in its place.

In that light, the AF circuit 124 may operate as a memory store for the fault addresses. Even though the AF circuit 124 may include conventional DRAM memory cells as the AF cells, the AF cells may be programmed in a way as to retain the programmed data in a non-volatile manner. As such, the AF cells may be characterized as non-volatile memory cells. For example, the AF cells may be "programmed" by breaking down an oxide of an associated capacitor of an AF cell, e.g., damaging the cell. The "programmed" AF cell may subsequently be read as a high logic state, for example, based on an increased leakage current of the damaged AF cell. The leakage current, for example, may be in a range from $10^{-10}$ to $10^{-6}$ amps, whereas leakage current of an undamaged cell may be on the order of $10^{-16}$ amps. This increase in leakage current may be sensed and amplified by sense amplifiers of the AF circuit 124 to determine a logic state of a programmed AF cell. The detected leakage current may correspond to a high logic state in some embodiments.

A process of reading the AF cells may be different from a process of reading a conventional DRAM cell since the leakage currents are low and may be washed out by any noise present in the AF circuit 124. The reading process may include setting the AF circuits to a ground state to clear out any charge built up in the AF cells, then pausing to allow the leakage current increase to a detectable level. As such, the damaged AF cells may operate as non-volatile memory cells since they may permanently provide a set logic state. Further, since the AF circuit 124 may be fabricated as a conventional DRAM memory die, the amount of die area needed for the AF circuit 124 may be minimized.

Figure 2:
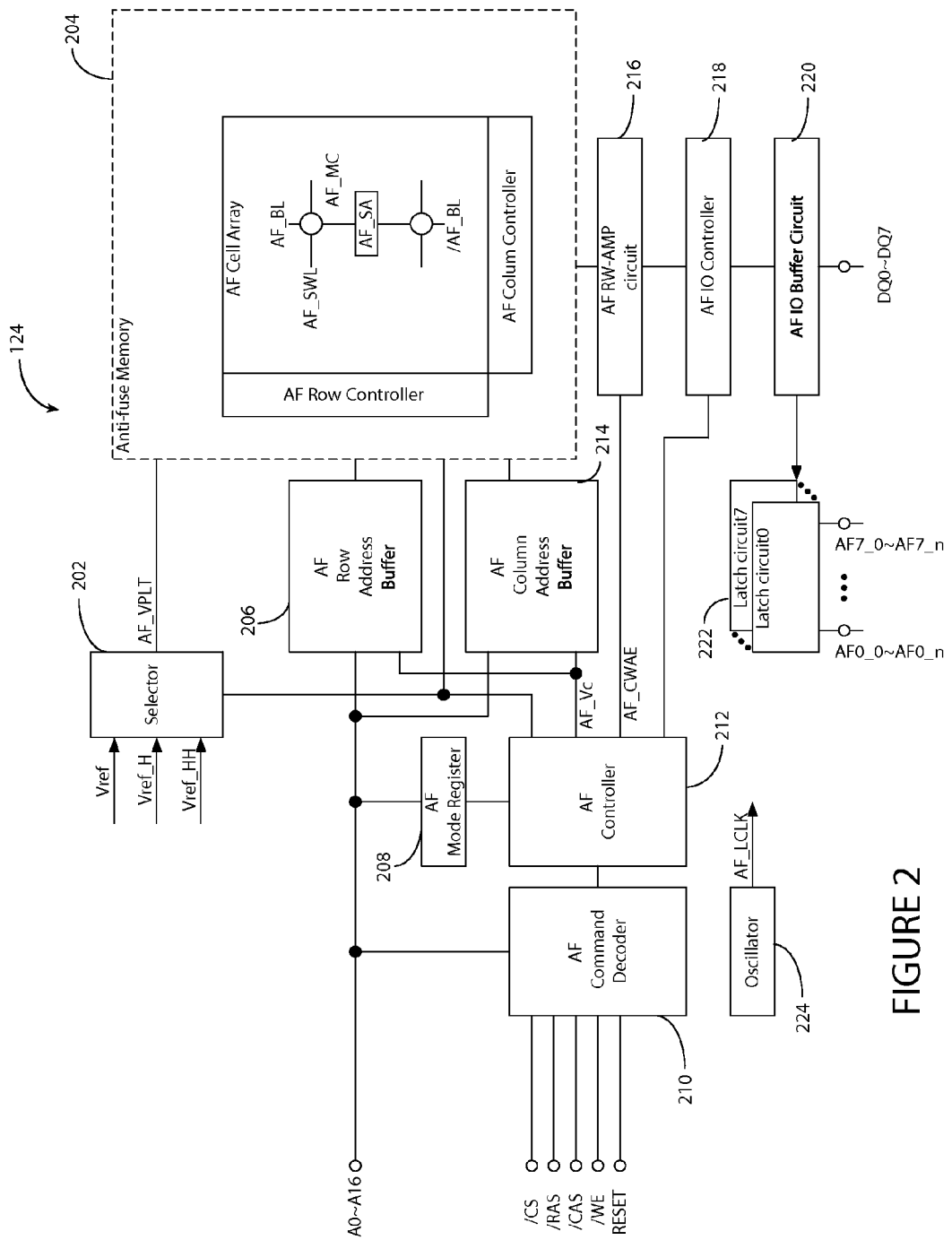
FIG. 2 is a block diagram of an anti-fuse circuit in accordance with the present disclosure.

FIG. 2 is a block diagram of an anti-fuse circuit 124 in accordance with the present disclosure. The AF circuit 124 may include many, if not all, of the same components included in a DRAM, such as the DRAM 100 of FIG. 1, with a few exceptions. Further, the AF circuit 124 may be included in the DRAM, and may act as a non-volatile memory area for storing fault addresses of rows/columns in the cell array 110 that include defective memory cells. The AF circuit 124 may not include the DLL 102, the voltage detector 104, or the voltage generator 106. Conversely, the AF circuit 124 may include components that the DRAM may not, such as a selector 202, an oscillator 224, an IO controller 218, and a plurality of latches 222. Even taking the differences of components into account, the AF circuit 124 may function similarly to a conventional DRAM. For example, the AF circuit 124 may receive a read command and an associated address, and read from the address in response. Because the AF circuit 124 may be used as non-volatile storage, a program command may be performed that a conventional DRAM memory may not include. A program command may result in one or more AF cells of the AF cell array 204 being "programmed" so that a logic state is stored in a non-volatile manner. As used herein, a "programmed" AF cell may be an AF cell that has had a dielectric of a capacitor damaged due to application of a reverse bias that is greater than the breakdown voltage of the dielectric.

The AF cell array 204 may be configured similar to the cell array 110 of the DRAM 100, but only one illustrative bank is shown in FIG. 2. More than one bank, however, may fall within the scope of the present disclosure. The AF cell array 204 may include a plurality of AF cells, e.g., DRAM memory cells, arranged in a grid and addressable through a plurality of AF bitlines and AF wordlines. The AF array 204 may also include a plurality of AF sense amplifiers coupled to various control and data lines (wordlines and bitlines), and configured to sense and amplify voltages on associated bitlines during read and write operations. The sense amplifiers may also be activated during program operations. Additionally, a cell plate may be included in the AF cell array and configured to couple to one node of each of the AF cells in the array. As will be discussed in more detail below, each of the AF cells may include a switch and a capacitor, where the capacitor is configured to store data as charge. The switch and capacitor may, for example, be coupled in series between a respective AF bitline and the cell plate. The cell plate may provide various voltages to one node of the capacitor during various commands, such as read, write, and program commands.

The AF circuit 124 may receive the reference voltages Vref, Vref_H and Vref_HH, address signals A0 to A16, and command signals /CS, /RAS, /CAS, /WE, and RESET. The command signals may constitute command information, and input/output signals DQ0 to DQ7. In response to signals and commands received, the AF circuit 124 may perform one or more internal operations similar to a conventional DRAM, and then provide signals AF0_0 to AF0_n ... AF7_0 to AF7_n and input/output signals DQ0 to DQ7. The signals AF0_0 to AF0_n ... AF7_0 to AF7_n may be the physical address of the redundant and/or fault rows/columns, which may be provided to the cell array 110 of DRAM 100, for example.

The plurality of latch circuits 222 may include latch circuits 0-7 corresponding to banks 0-7 of the cell array 110. The latch circuits 0-7 may be provided addresses stored in the AF cell array 204 indicating fault rows/columns of the memory array 110 of DRAM 100, for example. The addresses of the fault and/or redundant rows/columns may be provided to the plurality of latches 222 through the AF RW-amplifier circuit 216, the input/output (IO) controller 218, and the IO buffer circuit 220. The oscillator 224 may generate an internal clock signal AF_LCLK, which may be used in the AF circuit 124 for timing the internal operations Responsive to a control signal from the AF controller 212, the selector 202 may select and provide one of the reference voltages Vref, Vref_H and Vref_HH to the AF cell array 204. The reference voltage provided may depend on a command received by the AF command decoder, which may determine one or more internal operations to perform based on the received commands /CS, /RAS, /CAS, /WE, and RESET. For example, the reference voltage Vref_H may be provided during read commands. The reference voltage Vref_HH may be controlled so as to be applied during a program command, for example. In addition to the reference voltages, the AF circuit 124 may also receive the voltage VARY and the ground voltage VSS. By sequencing the various reference and supply voltages on the AF bitlines, AF wordlines, and AF cells, the AF cells may be programmed, read from, and written to, for example.

Figure 3:
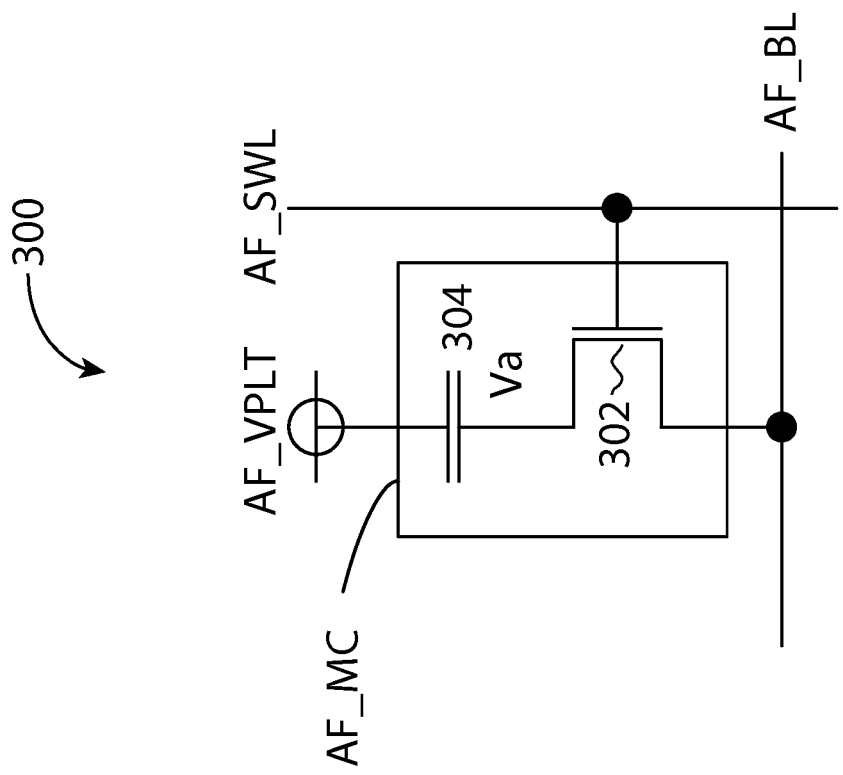
FIG. 3 is a schematic diagram of an example anti-fuse cell in accordance with the present disclosure.

FIG. 3 is an example anti-fuse cell 300 in accordance with the present disclosure. The AF cell 300 may be an AF cell included in the AF cell array 204 of FIG. 2. The AF cell 300 may include a switch 302 coupled in series with a capacitor 304. The switch 302, for example, may be a transistor including a gate, a drain and a source. The capacitor 304 may be a metal-dielectric capacitor using a conventional dielectric such as silicon dioxide or silicon nitride. The dielectric of the capacitor 304 may have a low breakdown voltage, 3.5 volts for example. The capacitor 304 may be coupled to an AF cell plate AF_VPLT by one node and coupled to the switch 302 at the node Va. The switch 302 may be coupled between the node Va and an AF bitline AF_BL. A gate of the switch 302 may be coupled to an AF sub-wordline AF_SWL.

The activation of the switch 302 may be based on a voltage applied to the AF sub-wordline AF_SWL. An activated switch 302 may couple the node Va to the AF bitline AF_BL. Voltage applied to the cell plate AF_VPLT in regards to voltages on the node Va may determine how the capacitor 304 stores charge. Further, a voltage applied across the capacitor 304 larger than a breakdown voltage of the dielectric may damage the capacitor 304, and in turn the AF cell 300. During a read operation, the voltage on the node Va may determine the programmed logic state of the AF cell 300. For example, zero volts at node Va may indicate a low logic state, whereas a positive voltage may indicate a high logic state.

Figure 4:
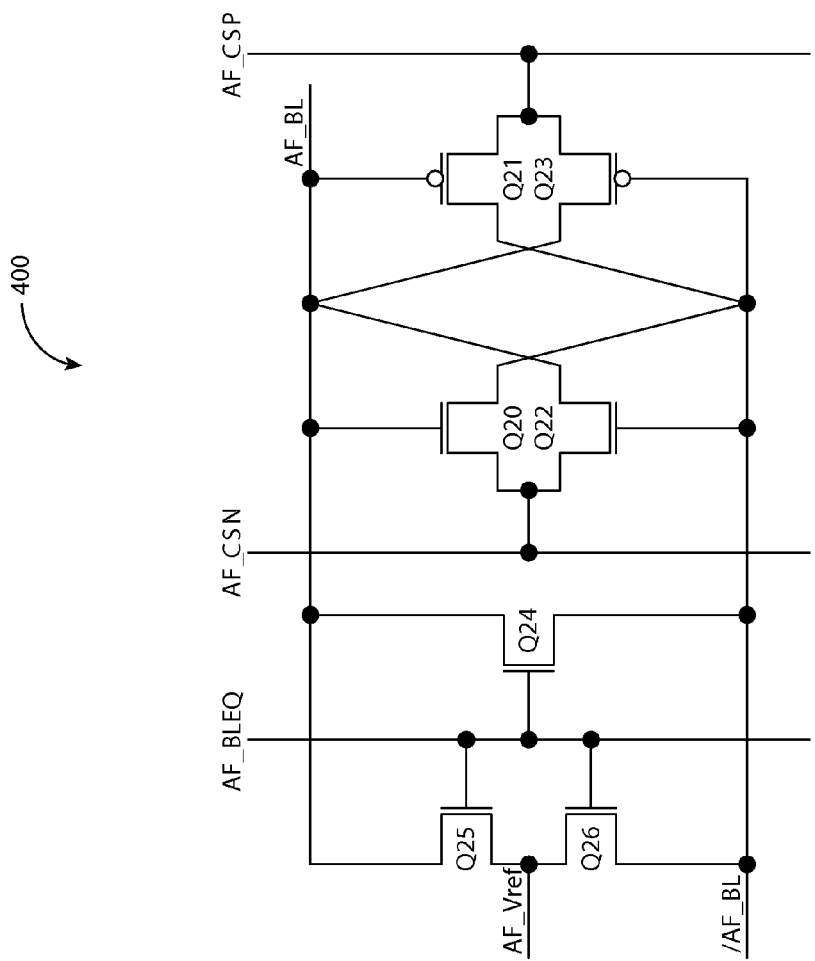
FIG. 4 is a schematic diagram of an example anti-fuse sense amplifier in accordance with the present disclosure.

FIG. 4 is an example anti-fuse sense amplifier 400 in accordance with the present disclosure. A plurality of AF sense amplifiers 400 may be included in the AF cell array 204 such that an AF sense amplifier 400 is associated with a respective AF bitline. The AF sense amplifier 400 may include transistors Q20-Q26 configured substantially as depicted in FIG. 4. Further, bitlines AF_BL and /AF_BL, AF equalization line (AF_BLEQ), AF control sense line (AF_CSN), and AF control sense line (AF_CSP) may be coupled to the AF sense amplifier 400. The complementary bitlines BL and /BL may also be coupled to the AF sense amplifier 400. The transistors Q20-Q23 represent the sense amplifier portion of the AF sense amplifier 400, and the transistors Q24-Q26 represent control switches for pre-charging and equalizing the complementary AF bitlines.

The AF sense amplifier 400 may be enabled through control lines AF_CSN and AF_CSP. Voltages applied through these control lines may activate the transistors Q20-Q23 so that a voltage difference between complementary AF bitlines AF_BL and /AF_BL may be sensed. The complementary AF bitlines AF_BL and /AF_BL may be pre-charged to Vref through transistors Q25 and Q26 when those transistors are enabled by a voltage applied to AF_BLEQ. The voltage applied to AF_BLEQ may also enable transistor Q24, which may equalize the voltage of complementary AF bitlines AF_BL and /AF_BL. By pre-charging and equalizing AF bitlines BL and /AF_BL, the AF sense amplifier 400 may be able to sense a voltage difference present on the complementary AF bitlines AF_BL and/AF_BL once the AF bitline AF_BL is coupled to an AF cell (not shown).

Figure 5:
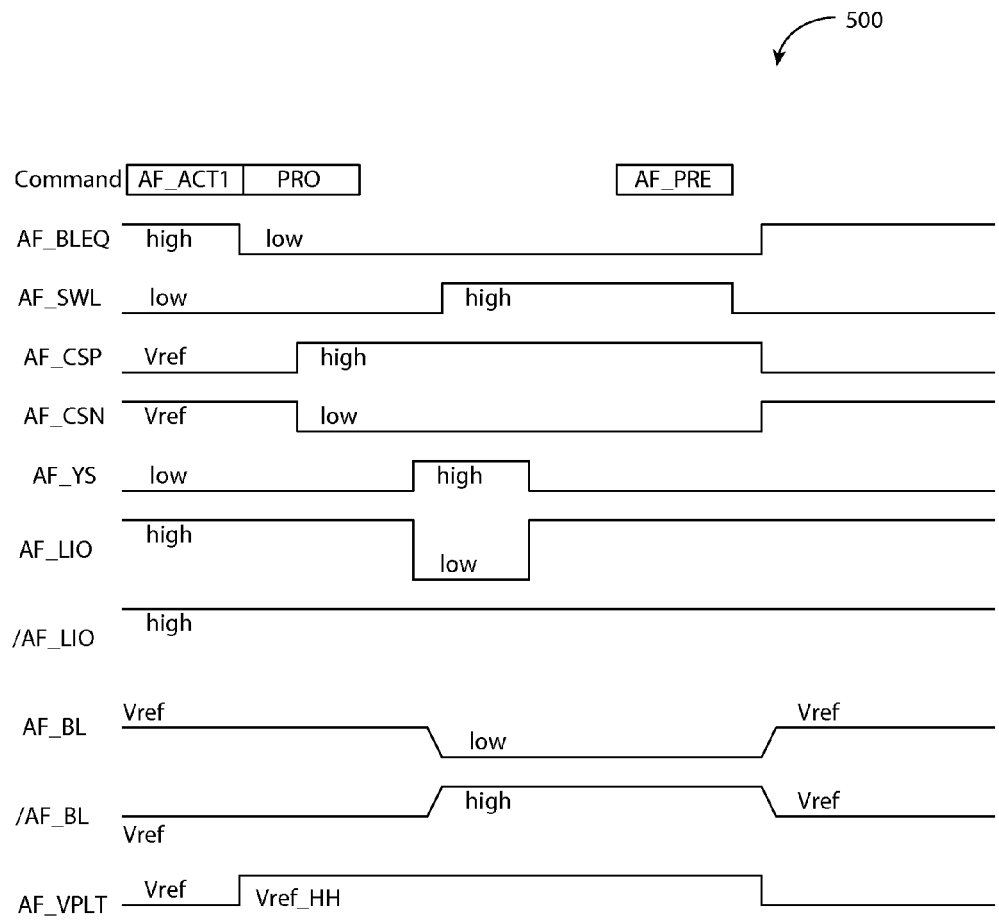
FIG. 5 is a timing diagram of an example programming timing diagram for programming an anti-fuse cell to be a high logic state in accordance with the present disclosure.

FIG. 5 is a timing diagram 500 for programming an anti-fuse cell to be in a high logic state in accordance with the present disclosure. The timing diagram 500 illustrates signals applied to various control and data lines of the AF circuit 124 as further described in FIGS. 3 and 4. A sequence of three commands—AF_ACT1, PRO, and AF_PRE—are shown in the timing diagram. The sequence of the commands may be based on a combination of command signals received by the AF command decoder 210. The AF command decoder 210 may receive the command signals, for example, from the DRAM 100 or a host, and decode the command signals into the sequence of internal operations to carry out that command. The AF_ACT1 command, for example, may be configured to finish pre-charging and equalizing the AF bitlines AF_BL and /AF_BL while providing the reference voltage Vref_HH to the cell plate AF_VPLT afterwards. The PRO command may be configured to program an AF cell to a high logic state, for example, and the AF_PRE command, which may be optional, may be configured to pre-charge the bitlines to ready them for a subsequent operation.

In response to the AF circuit 124 receiving the AF_ACT1 command, the AF_BLEQ line may first be at low level so the AF bitlines AF_BL and/AF_BL of the AF sense amplifier 400 are not pre-charged and equalized to Vref, for example. Also, afterwards, the reference voltage to be applied to the cell plate AF_VPLT (FIG. 3) may transition, e.g., increase, from the reference voltage Vref to the reference voltage Vref_HH. This change to the relatively higher reference voltage may be in preparation of a subsequent programming step.

After the AF_ACT1 command is performed, the AF circuit 124 may perform the PRO command. During operation of the PRO command, the AF sense amplifier 400 control lines AF_CSN and AF_CSP may be transitioned from Vref to low and high, respectively, to enable the sense amplifier. Here, low may be the supply voltage VSS and high may be the voltage VARY. After the sense amplifier is enabled, a control signal AF_YS may transition from low to high, which may couple complementary local input/output lines AF_LIO and /AF_LIO to respective AF bitlines AF_BL and /AF_BL. The complementary AF_LIO lines may carry a voltage representing a logic state to program into an AF cell. For example, to program an AF cell to be a high logic state, e.g., a "1," a low logic state, e.g., a "0," may be the target program state. After the complementary AF_LIO lines are coupled to the complementary AF bitlines, the AF_SWL may be driven high to enable an AF cell switch, such as the switch 302. The switch may then couple the AF_BL to the node Va. Based on the timing diagram 500, the AF_BL at this time may be at a low voltage such as the supply voltage VSS, e.g., zero volts, and the cell plate, which is coupled to the other side of the capacitor 304, may be coupled to reference voltage Vref_HH. Vref_HH may be selected so that the voltage across the capacitor 304, e.g., Vref_HH minus zero, may be greater than the breakdown voltage of the capacitor's dielectric. As such, the capacitor's dielectric may breakdown, e.g., be damaged. A damaged capacitor may be characterized as having increased leakage current. As will be shown below, a damaged capacitor may be read as a high logic state, e.g., a "1," in subsequent read operations.

The AF circuit 200 may optionally receive the pre-charge command AF_PRE. During the AF_PRE command, the control line AF_BLEQ may be transitioned to a high level, the sub-word line AF_SWL may be transitioned to a low level, and the control lines AF_CSP and AF_CSN may be transitioned to the reference voltage Vref. The AF bitlines AF_BL and /AF_BL may then be respectively pre-charged to the reference voltage Vref.

Figure 6:
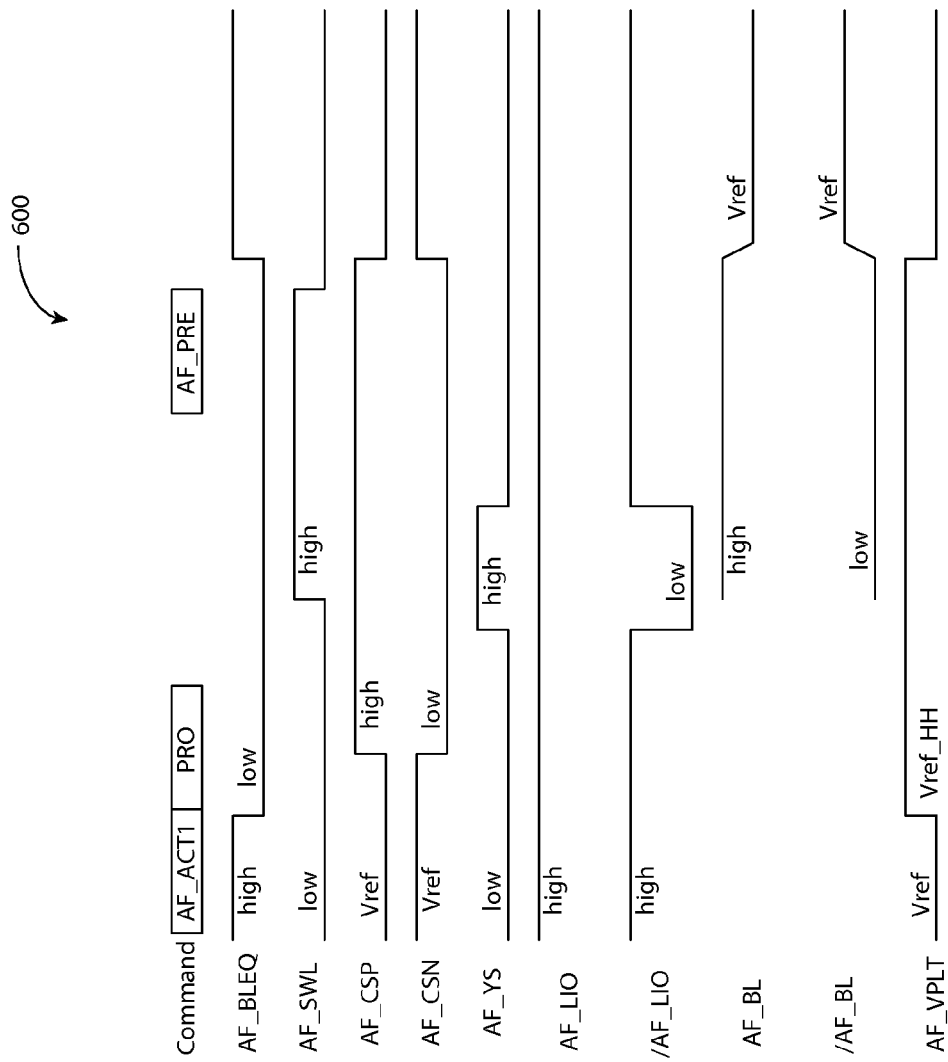
FIG. 6 is a timing diagram of an example programming timing diagram for programming an anti-fuse cell to be a low logic state in accordance with the present disclosure.

FIG. 6 is a timing diagram 600 for programming an anti-fuse to be in a low logic state in accordance with the present disclosure. The timing diagram 600 may depict a sequence of commands and voltages applied to control and data lines in order to program an AF cell to be a low logic state. Because a low logic state may be represented by zero voltage, the program operation may not result in damaging the capacitor of a cell. Yet, because a complete wordline AF_SWL of the AF cell array may be at high level, voltages may be applied to the AF cells to be programmed to the low logic state so that inadvertent damage does not occur. As such, to program a low logic state onto an AF cell, a high level may be applied to the bitline AF_BL so that a voltage across the capacitor is not greater than the dielectric's breakdown voltage.

The timing diagram 600 may be substantially similar to the timing diagram 500, and as such, only the differences will be described. Since no damage may be desired to an AF cell being programmed to a low logic state, a voltage VARY may be applied to the AF bitline during the PRO command operation. Because VARY is the operating voltage of the hosting DRAM, the voltage difference between Vref_HH and VARY may not be greater than the breakdown voltage of the capacitor's dielectric. Therefore, no damage may occur and the programmed cell may be considered to be a low logic state, e.g., a zero.

Figure 7:
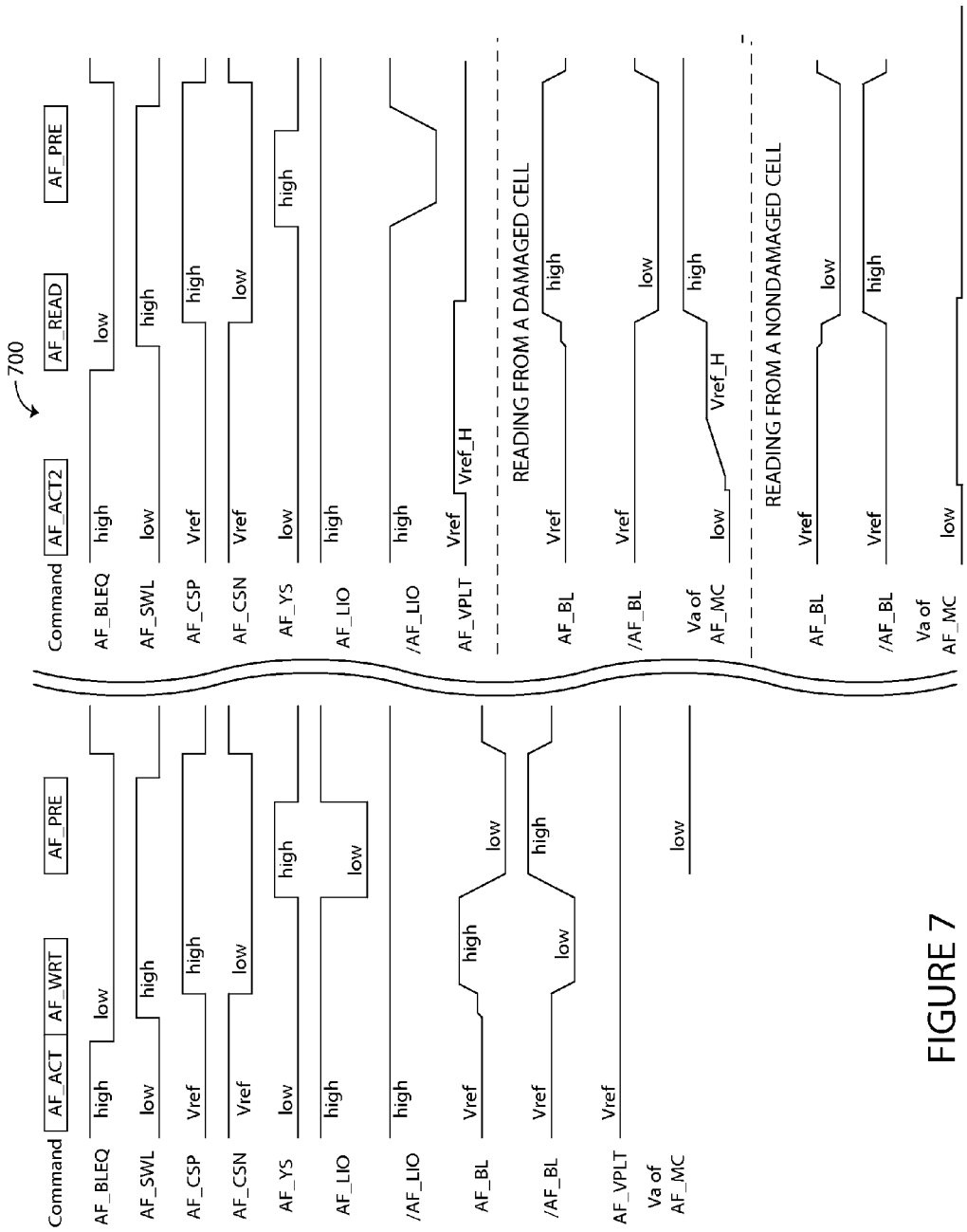
FIG. 7 is a timing diagram of an example read timing diagram for reading from anti-fuse cells in accordance with the present disclosure.

FIG. 7 is a timing diagram 700 for reading from an anti-fuse memory cell in accordance with the present disclosure. The anti-fuse memory cell in the example of FIG. 7 is programmed to a high logic state. The timing diagram 700 may depict a sequence of commands to read from the AF cell array 204, for example. Since the AF cell array 204 may include both damaged and undamaged AF cells, a set up step may be used to write a low logic state to all of the AF cells so that the node Va of all the cells are initially set to VSS, for example. Then a voltage between Vref and VARY, such as the reference voltage Vref_H, may be applied to the AF cell plate AF_VPLT. The damaged AF cells may then begin to generate a leakage current due to the voltage across the damages capacitors, e.g., Vref_H minus VSS, which may then be read as a high logic state. The undamaged cells may still be read as having a low logic state since no increase of leakage current may be present.

The timing diagram 700 includes a sequence of commands such as AF_ACT, AF_WRT, AF_PRE, AF_ACT2, AF_READ, and the optional AF_PRE. The commands AF_ACT and AF_PRE were discussed above and their description will not be repeated for sake of brevity. However, to provide context, the AF_ACT command may be performed to finish initializing the complementary AF bitlines to the reference voltage Vref and to finish equalizing the voltages on the AF bitlines. After the AF_ACT command, the AF_WRT command may be performed. This command may result in writing a low voltage to all of the cells of the AF array 204. As such, the AF_ACT command may also include a transition of the AF_SWL to a high voltage, voltage VARY for example, in order to enable the switch 302. The enabled switch 302 couples the node Va to the AF bitline AF_BL. The AF sense amplifier 400 may then be enabled by transitioning the control lines AF_CSN and AF_CSP to low and high, respectively. In turn, the complementary bitlines AF_BL and /AF_BL may be transitioned to high and low, respectively. After the control lines, wordline, and bitlines are set, the control signal AF_YS may transition high to couple the complementary AF_LIO lines to the complementary AF bitlines. AF_LIO may transition low, which may cause AF_BL to transition low. Further, since AF_BL is coupled to node Va, node Va is set at a low voltage, zero volts for example. This, as noted, may set all the AF cells of the AF cell array to zero volts. The command AF_PRE may then be performed to prepare the AF cell array 204 for a read command.

To read the AF cells, the last three commands may be performed after the AF cells have been set to low. The reference voltage applied to the cell plate AF_VPLT may transition from the reference voltage Vref to the reference voltage Vref_H. The voltage of Vref_H may be between the voltages of Vref and VARY, for example. The voltage of the node Va may then transition from the ground voltage VSS to a voltage (Vref_H—Vref) due to capacitive coupling. A damaged AF cell, due to its increased leakage current, may slowly display a larger voltage, such as the voltage Vref_H. In the succeeding pause period, 200 µs for example, the voltage of the node Va may gradually change from the voltage (Vref_H minus Vref) to the reference voltage Vref_H due to the leakage current of the damaged AF cell. Thereafter, a read command AF_READ may be issued, and since the reference voltage Vref_H may be higher than the reference voltage Vref, a high logic state may be sensed by the AF sense amplifier 400.

As for an undamaged cell, the bottom right portion of the FIG. 7 displays the change in voltage levels of the various data lines. The node Va line shows that while the cell plate AF_VPLT voltage is transitioned from Vref to Vref_H, the Va node voltage of an undamaged cell displays a slight increase of voltage, but not the additional gradual increase that a damaged cell displays. Further, once the cell plate AF_VPLT voltage is transitioned back to Vref from Vref_H, the node Va voltage similarly decreases. Thus, an undamaged AF cell may be read as a low logic state.

Figure 8:
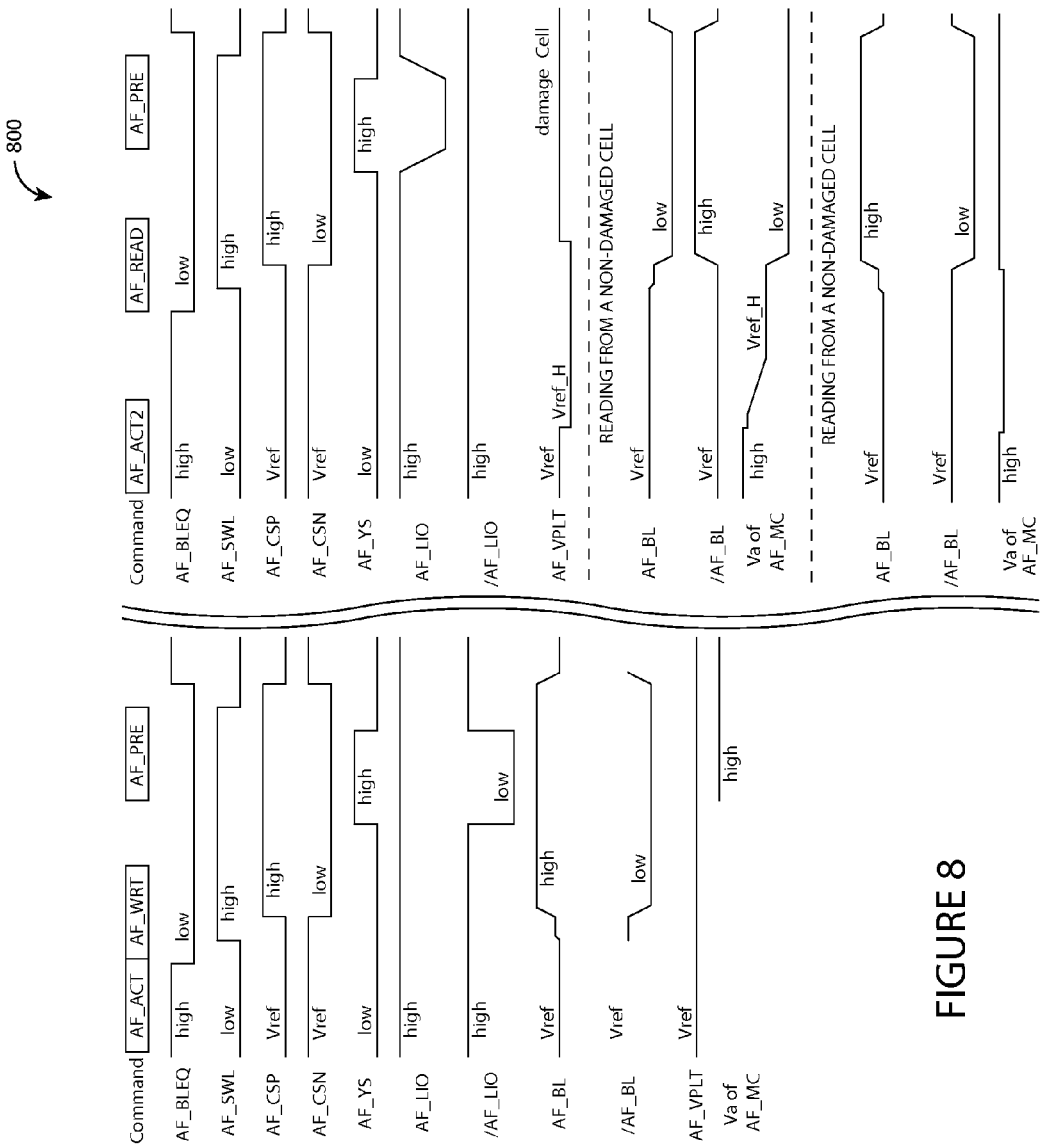
FIG. 8 is a timing diagram of an example read timing diagram for reading from anti-fuse cells in accordance with the present disclosure.

FIG. 8 is a timing diagram 800 for reading from anti-fuse memory cells in accordance with the present disclosure. The timing diagram 800 may differ only slightly from the timing diagram 700 of FIG. 7. For example, instead of initializing all of the AF cells to a low voltage, the timing diagram 800 displays the optional situation where all the AF cells initialized to a high voltage. In this optional situation, the damaged cells may be read as low logic state due to the leakage current causing the voltage at node Va to decrease below the voltage it was initially set.

The first of the three commands may be similar to the first three commands depicted in FIGS. 6 and 7 except instead of the AF_WRT command writing a low logic state to all of the AF cells in the AF cell array 204, the AF_WRT command is configured to write a high logic state to all of the AF cells of the AF cell array 204. Subsequently, during the AF_ACT2 command, the cell plate AF_VPLT may transition from Vref to Vref_H during the pause period. During this time, the voltage at node Va of a damaged cell may gradually reduce from a high voltage, e.g., voltage VARY, to the voltage of the cell plate AF_VPLT, e.g., Vref_H due to capacitive coupling of the capacitor 304. Further, the gradual change in the voltage at Va may be due to the increased leakage current of the damaged AF cell. Thus, because Vref_H is less than voltage Vref, the decreased voltage on the node Va may be sensed as a low logic state by the AF sense amplifier 400.

Conversely, the bottom right of FIG. 8 depicts the changes that occur in an undamaged AF cell in this optional situation. Since all of the AF cells may be initially set to a high logic state, e.g., voltage VARY, the node Va, even if the cell plate AF_VPLT is set to Vref_H, will not decrease due to the leakage current. There may be no decrease in the voltage at node Va because the leakage current of an undamaged AF cell may be too low to cause a change in voltage. Therefore, an undamaged AF cell in this optional situation may be sensed as a high logic state, e.g., voltage VARY.

Figure 9:
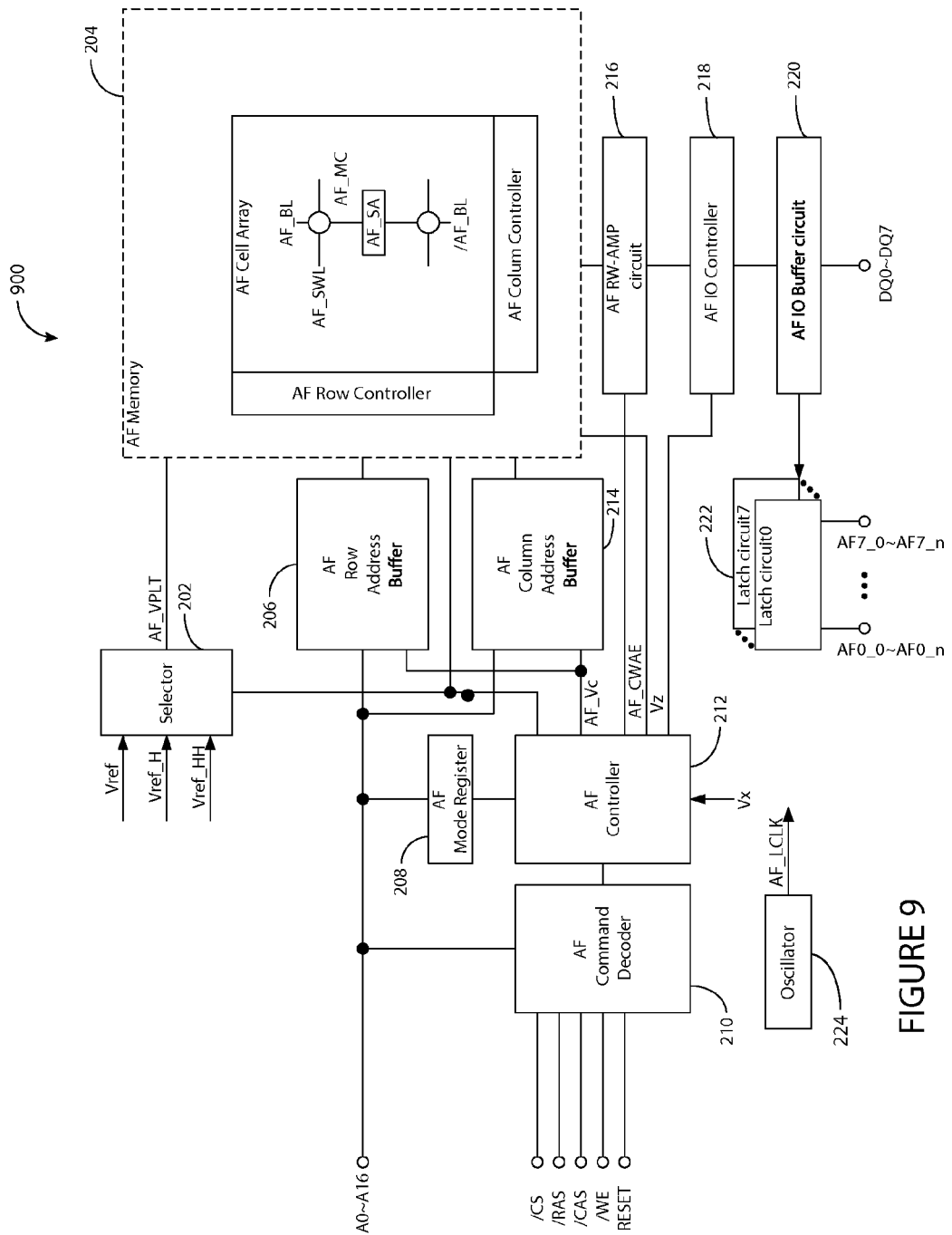
FIG. 9 is a block diagram of an example of an anti-fuse circuit in accordance with the present disclosure.

FIG. 9 is a block diagram of an anti-fuse circuit 900 in accordance with the present disclosure. The AF circuit 900 may be substantially similar to the AF circuit 124 except for a few differences. Whereas the AF circuit 124 may operate based on an internal clock signal generated by the oscillator 224, the AF circuit 900 may alternatively operate based on a control signal Vz provided to the AF cell array 204 by the AF controller 212 responsive to a control signal Vx. While the AF circuit 900 may operate based on the control signal Vz, an oscillator 224 may additionally be included in the AF circuit 900 to provide internal timing signals to time the operation of various commands. The control signal Vx may be provided to the AF controller 212 from the voltage detector 104 of the DRAM 100, for example. As will be discussed below, the assertion of the Vx signal high, for example, by the voltage generator 104 may prompt the AF controller 212 to perform a sequence of commands to read from the AF cell array 204. In addition to the Vx signal that prompts the read commands, some of the voltages on the AF bitlines may be different as well. However, the result of the commands may be the same. For example, the AF cells may be initially set to either a low or high voltage before a read command is performed after the pause time. During the pause time, the voltage at node Va of the damaged cells may gradually change due to the leakage current. The undamaged cells, as above, may not display a change in their node Va voltage.

Figure 10:
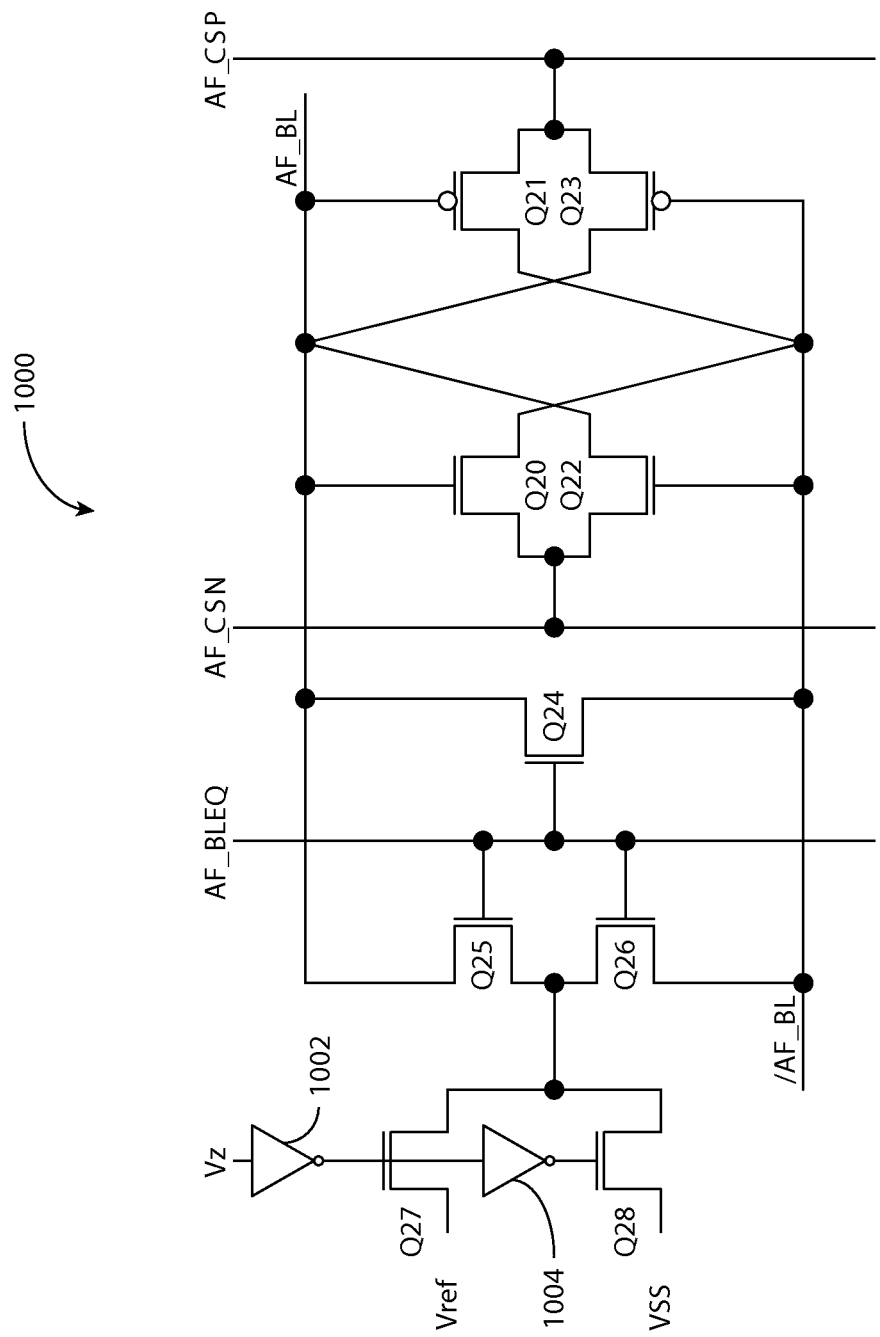
FIG. 10 is a schematic diagram of an example of an anti-fuse sense amplifier in accordance with the present disclosure.

FIG. 10 is a schematic diagram of an anti-fuse sense amplifier 1000 in accordance with the present disclosure. The AF sense amplifier 1000 may be similar to the AF sense amplifier 400 with the addition of control logic to alter the reference voltage to couple to the complementary AF bitlines. Transistors Q20-Q26 may be, included in the AF sense amplifier 1000 along with the additional transistors Q27 and Q28. The control logic may include a couple of series coupled inverters 1002 and 1004, which are configured to receive the control signal Vz. The transistor Q27 may be coupled to an output of the inverter 1002 and the transistor Q28 may be coupled to an output of the inverter 1004. The transistor Q27 may be configured to provide the reference voltage Vref to the AF bitlines, whereas the transistor Q28 may be configured to provide the supply voltage VSS to the AF bitlines. The control signal Vz may determine that one of Vref and VSS is provided to the AF bitlines.

Based on the logic state of the control signal Vz, either the voltage Vref or the voltage VSS may be provided to the AF sense amplifier 1000. The control signal Vz may propagate through the inverter 1002 before coupling to the transistor Q27, and the control signal Vz propagates through the inverter 1004 before coupling to the transistor Q28. Thus, the reference voltage applied to the AF bitlines may be based on the logic state of the control signal Vz. For example, if Vz is at a low logic state, then the transistor Q27 may be enabled and the transistor Q28 may not be. Based on a low logic state for Vz, the reference voltage Vref may be provided to the transistors Q25 and Q26. On the other hand, if Vz is at a high logic state, then the transistor Q27 may be disabled and the transistor Q28 may be enabled. As such, the reference voltage VSS may be provided to the transistors Q25 and Q26.

Regardless of the level of the control signal Vz, the AF sense amplifier 1000 may function substantially similar to the AF sense amplifier 400. For example, a voltage applied to the control line AF_BLEQ may pre-charge and equalize the complementary AF bitlines to either of the reference voltages Vref or VSS as discussed. Further, the transistors Q20-Q23 may be enabled based on the control lines AF_CSN and AF_CSP. By activating the transistors Q20-Q23, the AF sense amplifier 1000 may be readied to sense currents or voltages applied to the AF bitlines.

Figure 11:
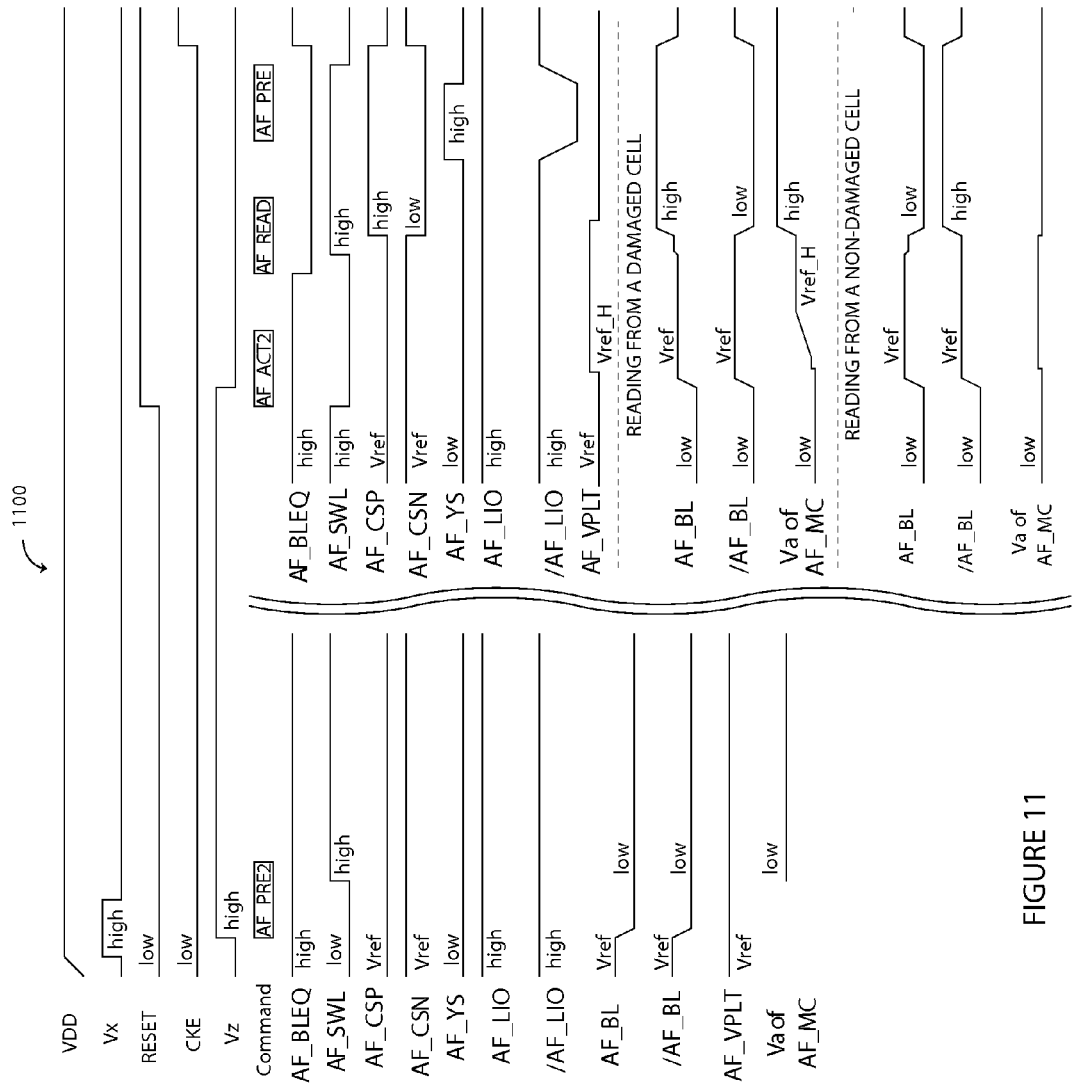
FIG. 11 is a timing diagram of an example read timing diagram for reading from anti-fuse cells in accordance with the present disclosure.

FIG. 11 is a timing diagram 1100 for reading from anti-fuse cells in accordance with the present disclosure. The timing diagram 1100 may depict a sequence of commands to read from the AF cell array 204, for example, which may be initiated by a change to the control signal Vx. The Vx signal may be provided by the voltage detector 104 of the DRAM 100 and may indicate a rise in the power supply voltage, e.g., from zero to VDD. This rise in the power supply voltage may indicate that the DRAM 100 is being enabled. As shown at the top of the timing diagram 1100, as the power supply voltage VDD increases to a set level, the voltage detector 104 detects the increase and may assert Vx high. The assertion of Vx high may be detected by the AF controller 212 of FIG. 9, which may begin to provide a sequence of commands to the AF circuit 900 to perform a read command, for example.

The assertion of Vx high may prompt the AF controller 212 of FIG. 9 to perform the commands AF_PRE2, AF_ACT2, AF_READ, and the optional command AF_PRE, in that order. As with the discussion of the other read timing diagrams contained herein, the AF cells in the AF array 204 may be first initialized to a set voltage, VSS for example, and then, after a pause, the voltage applied to the AF cell plate AF_VPLT may be increased from Vref to Vref_H. Damaged AF cells may then begin to gradually generate leakage current due to the voltage across the damaged capacitors, e.g., Vref_H minus VSS. This leakage current may cause the voltage at the node Va of a damaged cell to increase to Vref_H, which may be detected as a high logic state by a sense amplifier 1000. Undamaged cells, as discussed, above may provide a low voltage, which may be determined to be a low logic state.

To further illustrate, the AF bitlines may initially be coupled to Vref, but the AF controller 212 may assert Vz high in response to the high Vx signal. The high Vz signal may cause the logic of the AF sense amplifier 1000 to provide VSS to the AF bitlines. The AF cell plate AF_VPLT may be set to voltage Vref. As the AF sub-wordline is transitioned to high, the AF cell nodes Va may be coupled to the low voltage. Thus, there is a voltage difference across the capacitors of all the AF cells of the AF cell array 204. This voltage difference may be Vref minus VSS, for example. This command sets the AF cells ready for the AF_ACT2 command.

The AF_ACT2 command may assert the AF sub-wordline low to disconnect the node Va from the AF bitline AF_BL. During this pause period, leakage current may begin to conduct in damaged cells due to the voltage across their respective capacitors. The leakage current may cause the voltage Vref_H, which is on the AF cell plate, to be generated on the node Va. The command AF_ACT2 may also include asserting the AF sub-wordline high to couple the node Va to the AF bitline AF_BL through the switch 302 of an AF cell. While the switch is enabled, the AF sense amplifier 1000 may read a high logic state, e.g., a voltage of Vref_H, on the AF bitline AF_BL. The optional pre-charge command may then be performed.

How an undamaged cell performs under these commands is shown in the bottom right corner of FIG. 11. As shown in the timing diagram 1100, the voltage at node Va does not increase and may be read as a low logic state.

FIGS. 12A and 12B illustrate anti-fuse memory arrays including fault cell flag areas in accordance with the present disclosure. As discussed in regards to the memory cells of the DRAM 100, defects may occur in the memory array creating fault addresses, e.g., row and/or columns of the array unusable due to defective memory cells. This same problem, however, may affect the AF cell array 204. Defective AF cells may cause reliability issues for the AF circuit 124. Several techniques, however, may be available to alleviate this problem. Since the AF circuit 124 is essentially a DRAM within a DRAM, including another layer of anti-fuse circuitry may not be a great solution since there may be no end to the number of anti-fuse circuits required. Other solutions may involve including a flag area in the AF cell array 204 that indicates a row/column that includes a defective cell. In this case, that row/column may not be used. Another solution may include using multiple capacitors per a row/column, 3 instead of 1 for example, so that one or more defective capacitors, the smallest feature in the AF cell, may not affect the function of the AF cell.

FIG. 12A depicts a few columns and rows of an example AF cell array. Here, each sub-wordline may include a flag area. The flag area may be a single AF cell and may indicate whether that row is useable or not. For example, the AF cell in the flag area may be programmed high, as discussed above, to indicate a fault AF cell array row. An AF cell in the flag area programmed low, conversely, may indicate a good AF cell array row. The dark-filled circles in FIGS. 12 A and B represent a programmed AF cell, e.g., a damaged cell, which may represent a high logic state. The empty circles represent an undamaged cell, which may represent a low logic state. The circles that include an X represent a fault cell. Thus, the AF cells in the flag area for sub-wordlines 2 and 5 may be programmed high to indicate that those rows include a fault cell and should not be used.

The embodiment of FIG. 12 B includes a flag area including three flag cells per row. Expanding the flag area to include three AF cells may increase the reliability. A single cell flag area may suffer from a defective AF cell within the flag area, whereas a three-AF cell flag area may improve reliability.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
a plurality of word lines;
a plurality of bit lines;
a cell plate;
a plurality of cells, wherein each of the plurality of cells includes a switch and a capacitor coupled in series between an associated one of the bit lines and the cell plate, and wherein the switch is controlled by an associated one of the word lines; and
a control circuit configured to provide the cell plate with a first voltage and further configured to change the cell plate from the first voltage to a second voltage before one of the word lines is activated.

2. The apparatus of claim 1, wherein the control circuit is configured to change the cell plate from the first voltage to the second voltage responsive to a first operation.

3. The apparatus of claim 2, wherein the control circuit is configured to change the cell plate from the second voltage to the first voltage after the one of the word lines is activated.

4. The apparatus of claim 3, wherein the control circuit is configured to supply the plurality of bit lines with a first state responsive to the first operation before the one of the word lines is activated.

5. The apparatus of claim 2, wherein the control circuit is configured to supply the cell plate with the first voltage and change the cell plate from the first voltage to a third voltage responsive to a second operation while one of the word lines is activated.

6. The apparatus of claim 5, further comprising:
a selector configured to receive the first to third voltages and provide one of the first to third voltages to the cell plate.

7. The apparatus of claim 6, wherein the selector is configured to provide the second voltage to the cell plate responsive to the first operation, and provide the third voltage to the cell plate responsive to the second operation.

8. The apparatus of claim 7, further comprising:
a voltage generator configured to receive a power supply voltage and generate the first to third voltages.

9. The apparatus of claim 8, wherein each of the first and second voltages is less in absolute value than the power supply voltage, and the third voltage is greater in absolute value than the power supply voltage.

10. The apparatus of claim 5, wherein the first operation is a read operation.

11. The apparatus of claim 10, wherein the second operation is a programming operation, and a capacitor of a selected cell is provided a voltage larger than a breakdown voltage of a dielectric of the capacitor.

12. An apparatus, comprising:
a plurality of first word lines;
a plurality of first bit lines;
a first cell plate;
a plurality of first cells, wherein each of the plurality of first cells includes a first switch and a first capacitor coupled in series between an associated one of the plurality of first bit lines and the first cell plate, and wherein the first switch is controlled by an associated one of the plurality of first word lines;
a first control circuit configured to supply the first cell plate with a first voltage and maintain the first cell plate at the first voltage after one of the plurality of first word lines is activated;
a plurality of second word lines;
a plurality of second bit lines;
a second cell plate;
a plurality of second cells, wherein each of the plurality of second cells includes a second switch and a second capacitor coupled in series between an associated one of the plurality of second bit lines and the second cell plate, and wherein the second switch is controlled by an associated one of the plurality of second word lines; and
a second control circuit configured to supply the second cell plate with the first voltage and change the second cell plate from the first voltage to a second voltage before one of the plurality of second word lines is activated.

13. The apparatus of claim 12, wherein each of the plurality of first and second cells is a dynamic random access memory cell.

14. The apparatus of claim 13, wherein each of the plurality of first cells functions as a volatile memory cell and each of the plurality of second cells functions as a nonvolatile memory cell.

15. The apparatus of claim 14, wherein a fault address corresponding to a fault cell of the plurality of first cells is held at some of the plurality of second cells.

16. An apparatus, comprising:
a first cell array that comprises:
a plurality of first word lines;
a plurality of first bit lines;
a first cell plate;
a plurality of first cells, wherein each of the plurality of first cells includes a first switch and a first capacitor coupled in series between an associated one of the plurality of first bit lines and the first cell plate, and wherein the first switch is controlled by an associated one of the plurality of first word lines, and
wherein each of the plurality of first cells is configured to store data in accordance with an amount of charge stored on the first capacitor without deteriorating an electrical characteristic thereof; and a second cell array that comprises:
   a plurality of second word lines;
   a plurality of second bit lines;
   a second cell plate;
   a plurality of second cells, wherein each of the plurality of second cells includes a second switch and a second capacitor coupled in series between an associated one of the plurality of second bit lines and the second cell plate, and wherein the second switch is controlled by an associated one of the plurality of second word lines, and
   wherein each of the plurality of second cells is configured to store data in accordance with whether an electrical characteristic thereof has been deteriorated.

17. The apparatus of claim 16, further comprising:
a control circuit configured to supply the second cell plate with a first voltage and change the second cell plate from the first voltage to a second voltage before one of the plurality of second word lines is activated.

18. The apparatus of claim 17, further comprising:
a selector configured to receive the first and second voltages and output one of the first and second voltages to the second cell plate responsive to a control signal from the control circuit.

19. The apparatus of claim 18, further comprising:
a voltage generator configured to receive a power supply voltage and generate the first and second voltages based thereon.

20. The apparatus of claim 19, wherein the first voltage is less in absolute value than the power supply voltage, and the second voltage is larger in absolute value than the power supply voltage.

21. An apparatus, comprising:
a plurality of anti-fuse cells, wherein one or more of the plurality of anti-fuse cells are programmed to store one of a low state and a high logic state, and wherein each of the plurality of anti-fuse cells includes a capacitor; and
a controller coupled to the plurality of anti-fuse cells and configured to read the logic states stored in the plurality of anti-fuse cells, wherein the controller is configured to apply a first voltage to a first node of the capacitor and a second voltage to a second node of the capacitor during a first step of a command, and wherein the controller is further configured to alter the first voltage to a third voltage and decouple the second voltage from the second node of the capacitor during a second step of the command, wherein a voltage on the second node changes to the third voltage during the second step of the command.

22. The apparatus of claim 21, wherein each of the plurality of anti-fuse cells comprises a switch coupled between the second node of respective capacitor and a bitline, wherein the switch is enabled during the first step of the command to provide the second voltage to the second node of the capacitor.

23. The apparatus of claim 22, wherein the switch is disabled during the second step of the command to decouple the second node of the capacitor from the bitline.

24. The apparatus of claim 21, wherein one or more of the plurality of anti-fuse cells are programmed by applying a voltage across a dielectric of their respective capacitors, wherein the voltage is greater than a breakdown voltage of the dielectric.

25. The apparatus of claim 21, wherein the plurality of anti-fuse cells comprise dynamic random access cells.

* * * * *